United States Patent [19]

Ohashi et al.

[11] Patent Number: 5,256,901
[45] Date of Patent: Oct. 26, 1993

[54] CERAMIC PACKAGE FOR MEMORY SEMICONDUCTOR

[75] Inventors: Toshio Ohashi, Komaki; Masaki Wakayama, Kasugai, both of Japan

[73] Assignee: NGK Insulators, Ltd., Japan

[21] Appl. No.: 915,404

[22] Filed: Jul. 20, 1992

Related U.S. Application Data

[63] Continuation of Ser. No. 455,230, Dec. 22, 1989, abandoned.

[30] Foreign Application Priority Data

Dec. 26, 1988 [JP] Japan .............. 63-167871[U]

[51] Int. Cl.$^5$ ............... H01L 39/02; H01L 23/28; H01L 23/02
[52] U.S. Cl. ............... 257/680; 257/681; 257/704; 257/710; 361/390; 361/421; 361/820; 361/807; 174/52.4
[58] Field of Search ............. 357/72, 74, 80; 361/390, 392, 421; 174/52.4; 257/680, 681, 678, 698, 701, 704, 710

[56] References Cited

U.S. PATENT DOCUMENTS 4,629,824 12/1986 Gilder, Jr., et al. .............. 174/52

FOREIGN PATENT DOCUMENTS

| 39-240 | 1/1939 | Japan . |
| 47-51801 | 12/1972 | Japan . |
| 0040069 | 3/1977 | Japan ............. 357/80 |
| 0007172 | 1/1978 | Japan ............. 357/80 |
| 61-194751 | 8/1986 | Japan . |
| 0242964 | 10/1988 | Japan . |

OTHER PUBLICATIONS

'Cap with grooved seal band...', IBM Tech. Dis. Bull., vol. 28, No. 6, Nov. 1985 pp. 2699-2700.
JP-A-62-106 653, Patent Abstracts of Japan, vol. 11, No. 314 Oct. 13, 1987.
JP-A-60-21 544, Patent Abstracts of Japan, vol. 9, No. 140, Jun. 14, 1985.
JP-A-61-194 751, Patent Abstracts of Japan, vol. 11, No. 23, Jan. 22, 1987.
JP-A-62-98 649, Patent Abstracts of Japan, vol. 11, No. 306, Oct. 6, 1987.
JP-A-61-294 842, Patent Abstracts of Japan, vol. 11, No. 161, May 23, 1987.
JP-A-62-37 949, Patent Abstracts of Japan, vol. 11, No. 217, Jul. 14, 1987.
IBM Technical Disclosure Bulletin vol. 29, No. 7, Dec., 1986, pp. 3085-3087.

*Primary Examiner*—Rolf Hille
*Assistant Examiner*—David Ostrowski
*Attorney, Agent, or Firm*—Parkhurst, Wendel & Rossi

[57] ABSTRACT

A ceramic package for a memory semiconductor accommodates therein the memory semiconductor and is sealingly closed by an ultraviolet ray transmissible ceramic lid. The ceramic lid is made of a polycrystalline alumina and formed with at least one groove in a sealing portion with the ceramic package. With the arrangement, the ceramic package is superior in sealing strength, air-tightness and ultraviolet ray transmission and can easily accommodate any increase of memory amount of semiconductor elements.

8 Claims, 3 Drawing Sheets

FIG_3
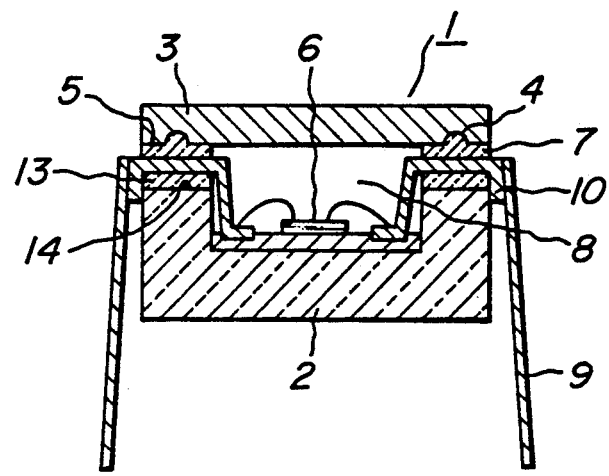
FIG_4
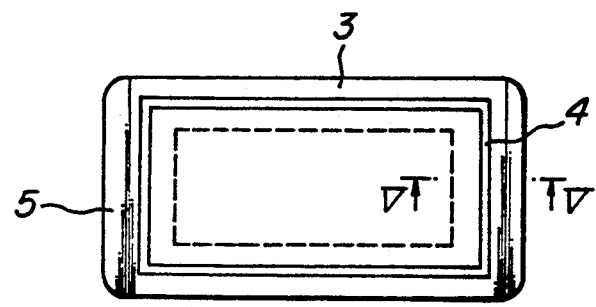

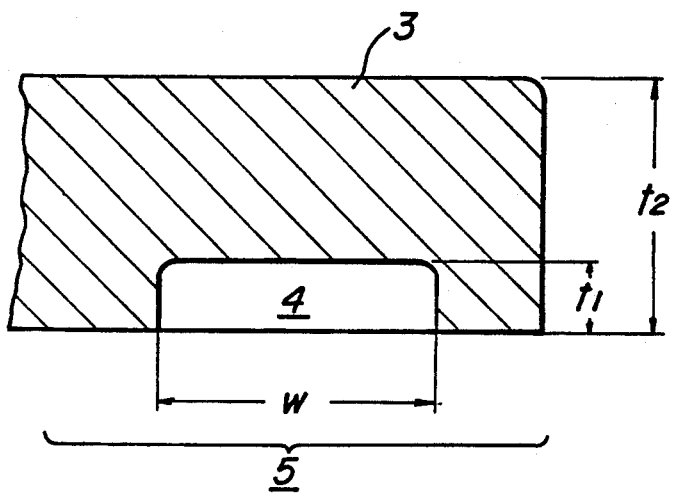
FIG_5
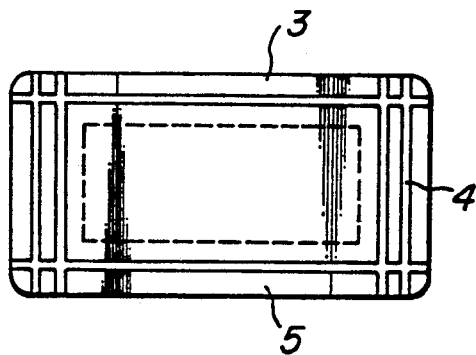
FIG_6
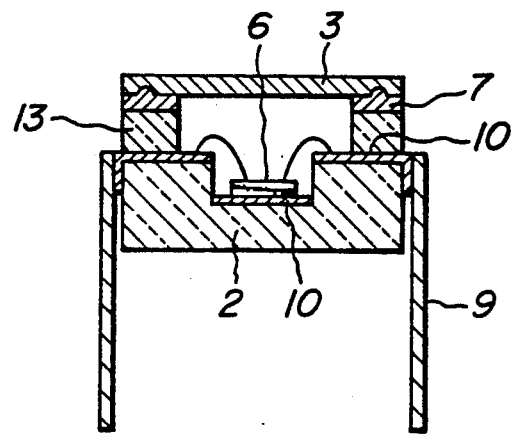
FIG_7

CERAMIC PACKAGE FOR MEMORY SEMICONDUCTOR

This is a continuation of application Ser. No. 07/455,230 filed Dec. 22, 1989, now abandoned.

BACKGROUND OF THE INVENTION

This invention relates to a ceramic package for a memory semiconductor, and more particularly to a package for an EPROM (erasable and programmable read only memory) semiconductor element which is able to erase information once memorized by irradiation of ultraviolet rays.

A package for EPROM has been know as disclosed in Japanese Patent Application Laid-open No. 61-194,751, in which an EPROM semiconductor element is arranged in a recess of a ceramic package and the recess is hermetically closed through a glassy material by an ultraviolet ray transmissible ceramic or glass lid.

In more detail, as shown in FIG. 1, a semiconductor element 6 and lead members 9 are fixed through glass layers 7 to a ceramic package 2 formed in its upper surface with a recess 8. Plate-shaped ceramic or a glass lid 3 is fixed through the glass layer 7 to the upper surface of the ceramic package 2 to seal the recess from the atmosphere.

Moreover, a ceramic package as shown in FIG. 2 also has been known. In this case, a bottom 11 of a recess 8 of the ceramic package 2, wire bonding portions 12 and a conductor 10 are metallized, respectively. Lead members 9 are brazed to both ends of the conductor 10. A ceramic frame 13 is arranged on an upper surface of the conductor 10 for locating lid 3 thereon. The ceramic lid 3 is fixed to an upper surface of the ceramic frame 13 by glass-sealing or brazing.

Alumina ceramic materials are generally used for the ceramic packages in consideration of thermal expansion, thermal conductivity, electrical characteristics as insulation resistance and the like, and mechanical strength. In order to be coincident with the package in thermal expansion, therefore, optically transmissible polycrystalline alumina is generally used as a material for the lid as disclosed in Japanese Patent Application Publication Nos. 39-240 and 47-51,801 and Japanese Patent Application Laid-open No. 63-242,964.

On the other hand, in order to accomplish higher degree of information processing and miniaturization, it has been required to increase memory amounts of the EPROM semiconductor elements and at the same time to miniaturize the ceramic packages for the memory semiconductors. However, since the density of the semiconductor elements has a limitation, sizes of the elements progressively increase as increasing the memory amounts. Moreover, sizes of the ceramic packages for the memory semiconductors have been standardized for the purpose of applying to circuit substrates as printed circuit boards. Therefore, it is difficult to change the sizes of the ceramic packages according to the increase of the sizes of the semiconductor elements.

This fact will be explained in a following example. It is assumed that a ceramic package (except a lid) has a width of 11 mm, a length of 20 mm and a thickness of 1.7 mm, an ultraviolet ray irradiated portion of a semiconductor element needs to have a size of about 9 mm×9 mm for 1 M bit and about 9 mm×14 mm for 2 M bit. In this case, a sealing portion of the ultraviolet ray transmissible lid to the ceramic package needs to have a width of about 1 mm for 1 and 2 M bit and a length of 11 mm for 1 M bit and 6 mm for 2 M bit. In other words, sealed areas are 139 $mm^2$ for 1 M bit and 94 $mm^2$ for 2 M bit. Accordingly, if an EPROM semiconductor element for 2 M bit is applied to a ceramic package hitherto standardized, sealing strength between the ceramic lid and the package becomes weak so that an air-tightness in the package is insufficient.

SUMMARY OF THE INVENTION

It is an object of the invention to provide a ceramic package capable of accommodating a high density memory semiconductor element which eliminates all the disadvantages of the prior art.

In order to accomplish the above object, in a ceramic package for a memory semiconductor, the ceramic package accommodating therein the memory semiconductor and sealingly closed by an ultraviolet ray transmissible ceramic lid, according to the invention the ceramic lid is made of a polycrystalline alumina and formed with at least one groove in a sealing portion with the ceramic package.

According to the invention the ceramic lid is formed with the groove in the sealing portion with the ceramic package so that the groove increases the sealing area which serves to improve the sealing strength, shearing strength, and air-tightness. Moreover, the ceramic package according to the invention has an advantage in that even if memory amounts of the semiconductor element increase, any enlargement of the ceramic package is not needed.

The invention will be more fully understood by referring to the following detailed specification and claims taken in connection with the appended drawings.

BRIEF DESCRIPTION OF THE DRAWINGS

FIG. 3 is a sectional view illustrating one embodiment of a ceramic package for a memory semiconductor according to the invention;

FIG. 4 is a plan view of a ceramic lid used in the ceramic package shown in FIG. 3;

FIG. 5 is a sectional view of the lid taken along the line V—V in FIG. 4;

FIG. 6 is a plan view of another embodiment of a ceramic lid used in the invention; and FIG. 7 is a sectional view illustrating a further embodiment of a ceramic package for a memory semiconductor according to the invention.

DETAILED EXPLANATION OF THE PREFERRED EMBODIMENTS

Figure 1:
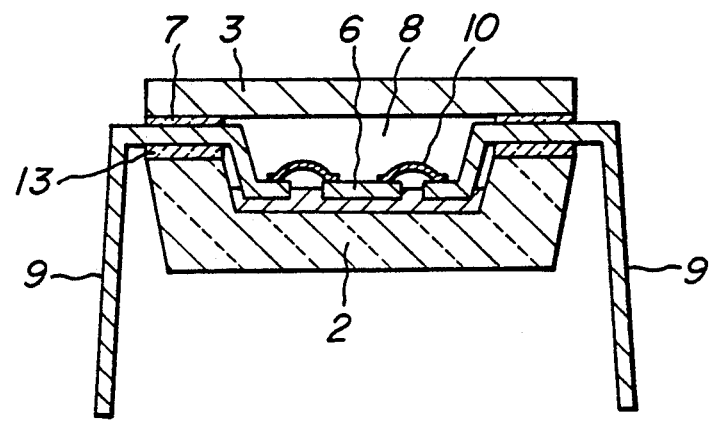
FIGS. 1 and 2 are sectional views illustrating embodiments of ceramic packages for memory semiconductors of the prior art.
Figure 2:
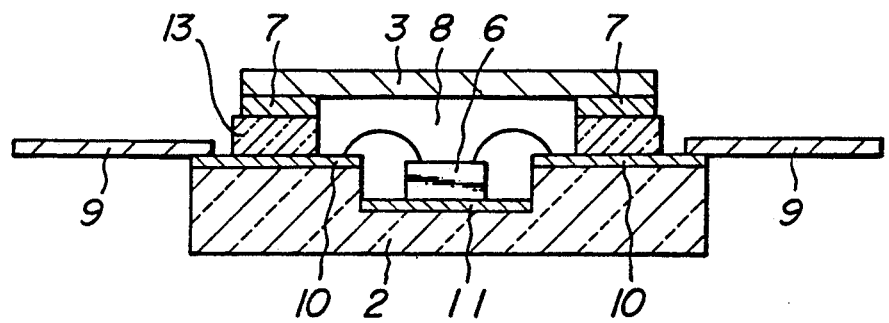

FIG. 3 illustrates one embodiment of a ceramic package for a memory semiconductor according to the invention. The ceramic package 2 made of alumina or the like is formed in its upper surface with a recess 8. An EPROM semiconductor element 6 for memory is arranged on a bottom of the recess 8. Lead members 9 are secured to the package 2 from the bottom along side walls and shoulders 14 of the package 2 by means of glass layers 7. A ceramic lid 3 in the form of a flat plate is fixed to an upper surface of the ceramic package 2 through a glass layer 7 between the shoulders 14 and a sealing portion 5 of the ceramic lid 3 to seal the recess 8 from atmosphere.

As shown in FIGS. 4 and 5, the lid 3 is formed at the sealing portion 5 with a groove 4 located substantially at a center of the sealing portion 5 along its entire circumference.

A sectional shape of the groove 4 is rectangular having a width w and a depth $t_1$ as shown in FIG. 5. The width w is dependent on a width of the shoulder 14 of the package 2 or a size of the sealing portion 5 and is usually 0.35–0.5 mm.

The depth $t_1$ is to be as large as possible in consideration of a thickness $t_2$ and a mechanical strength of the ceramic lid 3 so as to make higher the bonding strength between the lid 3 and the ceramic package 2 and at the same time to improve an air-tightness of the recess 8. On the other hand, however, the thickness $t_2$ of the ceramic lid 3 is preferably as thin as possible in order to miniaturize the ceramic package and to increase the transmission of ultraviolet rays. In the case using an ultraviolet ray transmissible polycrystalline alumina, therefore, the thickness $t_2$ is 0.2–0.35 mm in view of its mechanical strength, whereas the depth $t_1$ is preferably 40–80 μm which is less than one half of the value of $t_2$. The thickness $t_1$ is more preferably about 50 μm in consideration of a producing method later described.

A material of the lid is preferably an optically transmissible polycrystalline alumina having an optical transmission of more than 60% with a wave length of 2,537 Å at a thickness of 0.2 mm of the lid. For example, materials of $Al_2O_3$-MgO group and $Al_2O_3$-MgO rare earth group disclosed in Japanese Patent Application Publications Nos. 39-240 and 47-51,801 are used. However, a polycrystalline alumina having crystal grain diameters less than 8 μm and superior in bending strength as disclosed in Japanese Patent Laid-open No. 63-242,964 is more preferable.

The configuration of the groove 4 is not limited to that shown in FIG. 4. For example, plural grooves may be partially arranged as shown in FIG. 6. In the embodiment shown in FIG. 6, a plurality of intersecting straight grooves are arranged along sides of the lid 3. Moreover, different from the groove 4 extending all over the sealing portion 5 as shown in FIGS. 4 and 5, grooves may be partially provided so long as a sealing strength between the ceramic lid and the package is securely more than a predetermined value.

Furthermore, the construction of the ceramic package is not limited to that shown in FIG. 3. For example, the invention is applicable to a ceramic package as shown in FIG. 7. In this case, a bottom of a recess of a ceramic package and a conductor 10 are metallized and lead members 9 are brazed to both ends of the conductor 10. A ceramic frame 13 is arranged on an upper surface of the conductor 10 and a ceramic lid 3 is fixed to an upper surface of the ceramic frame by glass-sealing.

In forming the groove 4 of the ceramic lid, diamond blades may be used to form the groove at predetermined positions in a green body or sintered body of polycrystalline alumina. It is preferable for mass-production to press green bodies by means of metal dies having protrusions corresponding to the groove. Thereafter, the green bodies are fired to make ceramic lids.

EXAMPLE

Aluminum oxide powder having a purity of more than 99.9% and a specific surface area of 5.2 mm²/g obtained by thermal decomposition of aluminum ammonium sulfate was mixed with magnesium oxide of 0.1 weight % and binding aids (polyvinyl alcohol and polyethylene glycol) to prepare a powder for pressing. The powder was pressed into a green body at a pressure of 2,000 kg/cm² by the use of a metal die having protrusions corresponding to the groove shown in FIG. 4 or 5 and a metal die devoid of a protrusion. The green body was then fired at 1,500° C. in a non-oxidizing atmosphere to obtain a ceramic lid having a width of 1 mm, a length of 20 mm and a thickness of 0.25 mm. A width and a depth of the ceramic lid were 0.4 mm and 0.05 mm. The lid was then adhered through glass layers and lead members to a package made of black alumina as shown in FIG. 3 to obtain a ceramic package for a memory semiconductor.

Adhered strengths of the lids to the ceramic packages thus produced were tested by measuring shearing strengths when loads were applied to sides of the lids. Packages having grooves in lids exhibited adhered strengths 1.5 times higher than those of packages having no grooves. On the other hand, ceramic packages were put in the thermal cycle condition whose temperatures were kept at 0° and 100° C. respectively for six minutes. Such a thermal cycle was repeated fifteen times and thereafter air-tightness were inspected by means of a helium leak detector. No packages having grooves exhibited air-tightness less than $10^{-10}$ atm·cc/sec Three packages among ten packages having no grooves exhibited air-tightness less than $10^{-10}$ atm·cc/sec As can be seen from the above explanation, the ceramic package for a memory semiconductor according to the invention is superior in sealing strength, air-tightness and ultraviolet ray transmission and can easily accommodate any increase of memory amount of semiconductor elements. The ceramic package according to the invention has such significant effects and is very effective in practical use.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A ceramic package for a memory semiconductor, comprising:
    a ceramic package body having substantially flat shoulder portions which define a recess to accommodate said memory semiconductor;
    a ceramic lid comprising ultraviolet ray-transmissible polycrystalline alumina, a portion of said ceramic lid being fixed to said substantially flat shoulder portions of said ceramic package body through glass sealing means, said portion of said ceramic lid having at least one continuous groove of rectangular cross-section formed therein; and
    electrical leads for providing electrical communication between said memory semiconductor and an exterior of said ceramic package.

2. The ceramic package of claim 1, wherein said at least one continuous groove is formed in said portion of said ceramic lid in substantial alignment with a center of said shoulder portions of said ceramic package.

3. The ceramic package of claim 1, wherein said at least one continuous groove consists of a plurality of intersecting straight grooves along sides of said ceramic lid.

4. The ceramic package of claim 1, wherein said ceramic lid is made of a ceramic material selected from the group consisting of the Al$_2$O$_3$-MgO group and the Al$_2$O$_3$-MgO-rare earth group.

5. A ceramic package for a memory semiconductor, comprising:
- a ceramic package body having substantially flat shoulder portions which define a recess to accommodate said memory semiconductor;
- a ceramic lid comprising ultraviolet ray-transmissible polycrystalline alumina, a portion of said ceramic lid being fixed to said substantially flat shoulder portions of said ceramic package body through glass sealing means, said portion of said ceramic lid having at least one continuous groove formed therein, wherein a depth of said at least one continuous groove is less than one-half of a thickness of said ceramic lid; and
- electrical leads for providing electrical communication between said memory semiconductor and an exterior of said ceramic package.

6. The ceramic package of claim 5, wherein the thickness of said ceramic lid is 0.2–0.35 mm and the depth of said at least one continuous groove is 40–80 μm.

7. The ceramic package of claim 5, wherein the thickness of said ceramic lid is 0.2–0.35 mm and the depth of said at least one continuous groove is 50 μm.

8. A ceramic package for a memory semiconductor, comprising:
- a ceramic package body having substantially flat shoulder portions which define a recess to accommodate said memory semiconductor;
- a ceramic lid comprising ultraviolet ray-transmissible polycrystalline alumina, a portion of said ceramic lid to be fixed to said substantially flat shoulder portions of said ceramic package body having at least one continuous groove formed therein;
- glass sealing means interposed between said portion of said ceramic lid and said substantially flat shoulder portions of said ceramic package body, said glass sealing means extending over the entirety of said shoulder portions, and extending into said groove and over portions of said ceramic lid adjacent both sides of said groove.

* * * * *